(12) United States Patent
Mahalingam et al.

(10) Patent No.: US 10,178,800 B2
(45) Date of Patent: Jan. 8, 2019

(54) SUPPORT STRUCTURE FOR ELECTRONICS HAVING FLUID PASSAGEWAY FOR CONVECTIVE HEAT TRANSFER

(71) Applicant: HONEYWELL INTERNATIONAL INC., Morris Plains, NJ (US)

(72) Inventors: Saravana Mahalingam, Karnataka (IN); Abhay Naik, Karnataka (IN); Yathiraj Kasal, Karnataka (IN); Rakesh Hota, Karnataka (IN); Rajendra Prasad Vrukshavai, Karnataka (IN); Mathews Leslie Kuriakose, Karnataka (IN); Ravi Anekal Radhakrishnan, Karnataka (IN)

(73) Assignee: HONEYWELL INTERNATIONAL INC., Morris Plains, NJ (US)

( * ) Notice: Subject to any disclaimer, the term of this patent is extended or adjusted under 35 U.S.C. 154(b) by 0 days.

(21) Appl. No.: 15/474,486

(22) Filed: Mar. 30, 2017

(65) Prior Publication Data
US 2018/0288900 A1 Oct. 4, 2018

(51) Int. Cl.
*H05K 7/20* (2006.01)
*H05K 7/14* (2006.01)

(52) U.S. Cl.
CPC ....... *H05K 7/20263* (2013.01); *H05K 7/1427* (2013.01); *H05K 7/20272* (2013.01)

(58) Field of Classification Search
None
See application file for complete search history.

(56) References Cited

U.S. PATENT DOCUMENTS

| | | | | |
|---|---|---|---|---|
| 4,513,352 A * | 4/1985 | Bennett | ............. | H05K 7/20336 165/902 |
| 5,181,167 A * | 1/1993 | Davidson | ............... | H05K 7/023 165/80.3 |
| 5,426,563 A * | 6/1995 | Moresco | ............... | H01L 21/486 257/E23.065 |
| 5,469,331 A * | 11/1995 | Conway | ............. | H05K 7/20254 165/80.3 |
| 6,059,020 A | 5/2000 | Jairazbhoy et al. | | |
| 6,084,771 A * | 7/2000 | Ranchy | ............. | H05K 7/20927 165/185 |
| 6,169,247 B1 * | 1/2001 | Craft, Jr. | .............. | H05K 7/1424 174/15.1 |
| 7,200,007 B2 * | 4/2007 | Yasui | .................... | H02M 7/003 165/80.4 |
| 7,237,604 B2 * | 7/2007 | Emrich | ................. | F28D 9/0043 165/167 |
| 7,286,365 B2 * | 10/2007 | Sarno | ...................... | H01L 25/18 174/16.3 |

(Continued)

*Primary Examiner* — Xanthia C Cunningham
(74) *Attorney, Agent, or Firm* — Lorenz & Kopf, LLP (57) ABSTRACT

A support structure for an electronic component a chassis and a standoff that is attached to the chassis. The standoff is configured to support the electronic component and separate the electronic component at a distance away from the chassis. The standoff is configured to receive heat generated by the electronic component. The standoff includes a fluid passageway. The fluid passageway is configured to allow a cooling fluid to flow therethrough for convective heat transfer from the standoff to the cooling fluid.

20 Claims, 8 Drawing Sheets

(56) References Cited

U.S. PATENT DOCUMENTS

| | | | | |
|---|---|---|---|---|
| 7,345,877 B2* | 3/2008 | Asfia | | H05K 7/20672 |
| | | | | 165/104.33 |
| 7,698,815 B2* | 4/2010 | Garner | | H01L 23/4093 |
| | | | | 29/890.032 |
| 7,824,075 B2* | 11/2010 | Maxik | | F21V 29/006 |
| | | | | 362/294 |
| 7,835,151 B2* | 11/2010 | Olesen | | H01L 23/473 |
| | | | | 165/121 |
| 8,024,936 B2* | 9/2011 | Storm | | F28D 15/06 |
| | | | | 165/180 |
| 8,047,268 B1* | 11/2011 | Kroliczek | | F28D 15/046 |
| | | | | 165/104.21 |
| 8,149,579 B2* | 4/2012 | Jadric | | H05K 7/20936 |
| | | | | 165/80.4 |
| 8,223,494 B2* | 7/2012 | Bult | | H05K 7/20672 |
| | | | | 165/104.33 |
| 8,359,744 B2* | 1/2013 | Hislop | | B22F 3/1055 |
| | | | | 29/890.03 |
| 8,421,235 B2* | 4/2013 | Ide | | H01L 23/473 |
| | | | | 257/675 |
| 8,582,298 B2* | 11/2013 | Facusse | | H05K 7/20809 |
| | | | | 361/710 |
| 8,839,519 B2* | 9/2014 | Altman | | F28F 3/12 |
| | | | | 165/104.33 |
| 9,081,054 B2* | 7/2015 | Nishiura | | H05K 7/20218 |
| 9,291,404 B2* | 3/2016 | Tamura | | F28F 3/02 |
| 9,320,182 B2* | 4/2016 | Steger | | H05K 7/20927 |
| 2003/0089486 A1 | 5/2003 | Parish et al. | | |
| 2005/0274490 A1 | 12/2005 | Larson | | |
| 2009/0213547 A1* | 8/2009 | Schulz-Harder | | H01L 23/473 |
| | | | | 361/702 |
| 2010/0033921 A1* | 2/2010 | Copeland | | H05K 7/20781 |
| | | | | 361/679.47 |
| 2014/0319390 A1* | 10/2014 | Strauss | | F16K 31/02 |
| | | | | 251/129.01 |
| 2015/0305198 A1* | 10/2015 | Brandt | | H05K 7/20218 |
| | | | | 361/699 |
| 2016/0010772 A1* | 1/2016 | Tiberghien | | B23P 15/26 |
| | | | | 165/177 |
| 2016/0069622 A1* | 3/2016 | Alexiou | | G06F 1/1656 |
| | | | | 165/146 |
| 2016/0227672 A1* | 8/2016 | Lin | | H05K 7/20254 |
| 2017/0164517 A1* | 6/2017 | Kim | | H05K 7/20336 |

* cited by examiner

SUPPORT STRUCTURE FOR ELECTRONICS HAVING FLUID PASSAGEWAY FOR CONVECTIVE HEAT TRANSFER

TECHNICAL FIELD

The present disclosure generally relates to a support structure for supporting one or more electronic components such as a printed circuit board (PCB) and relates, more particularly, to a support structure for electronic components having one or more fluid passageways for convective heat transfer and convective cooling of the electronics.

BACKGROUND

Some devices include a number of electronic components, such as printed circuit boards (PCBs) for operating the device. Typically, the PCB mechanically supports and electrically connects electronic components using conductive tracks, pads, and other features that are etched from conductive material laminated on a non-conductive substrate. The PCB may be supported by a support structure that maintains the PCB in a predetermined position and that maintains an electric connection to other components.

In some cases, the support structure may provide features that cool the PCB and maintain the PCB within a predetermined operating temperature range. However, some structures may be of limited use for some situations. The structure may not provide effective cooling given the number of PCBs, the heat load from the PCBs, the ambient temperature, and other factors.

Also, some support structures may be too bulky for some environments. For example, the support structure may not be compact enough for use within an aircraft or other vehicle, given the limited amount of available space. If there are a large number of electronics components to be cooled, the structure may be quite bulky. Additionally, the support structure and its associated cooling features can add a significant amount of weight to the vehicle, which can negatively impact fuel efficiency of the vehicle and/or other vehicle performance characteristics.

Thus, it is desirable to provide a compact support structure for electronic components that securely maintains the electronic components in a predetermined position and that provides increased cooling efficiency and cooling effectiveness for the electronic components. Other desirable features and characteristics of the present disclosure will become apparent from the subsequent detailed description and the appended claims, taken in conjunction with the accompanying drawings and this background discussion.

BRIEF SUMMARY

In one embodiment, a support structure for an electronic component is disclosed. The support structure includes a chassis and a standoff that is attached to the chassis. The standoff is configured to support the electronic component and separate the electronic component at a distance away from the chassis. The standoff is configured to receive heat generated by the electronic component. The standoff includes a fluid passageway. The fluid passageway is configured to allow a cooling fluid to flow therethrough for convective heat transfer from the standoff to the cooling fluid.

In another embodiment, a method of manufacturing a support structure for an electronic component is disclosed. The method includes forming a chassis and forming a standoff. The method further includes attaching the standoff to the chassis. The standoff is configured to support the electronic component separated at a distance from the chassis and such that the standoff is configured to receive heat generated by the electronic component. Forming the standoff includes forming the standoff with a fluid passageway configured to allow a cooling fluid to flow therethrough for convective heat transfer from the standoff to the cooling fluid.

In an additional embodiment, a support structure for electronics is disclosed that includes a chassis that includes a base, at least one sidewall that is integrally attached to the base, and a top wall that is supported by the at least one sidewall. The top wall is spaced apart from the base. The base, the at least one sidewall, and the top wall collectively define an interior of the chassis. At least one sidewall includes a sidewall fluid passageway. The top wall includes a first aperture and a second aperture. The first aperture is in fluid communication with the sidewall fluid passageway. The support structure also includes a standoff that is integrally attached to the base and extends between the base and the top wall along an axis. The standoff includes a standoff fluid passageway that is in fluid communication with the second aperture. The support structure additionally includes a first printed circuit board (first PCB) that is supported by the standoff within the interior of the chassis. The standoff spaces the first PCB and the base of the chassis apart at a first distance. Also, the support structure includes a spacer that is supported by the standoff. The spacer includes a plurality of projections that project outward and away from the standoff. Furthermore, the support structure includes a second printed circuit board (second PCB) that is supported by the spacer apart at a second distance away from the first PCB. Also, the support structure includes a fan that is supported by the chassis outside the interior of the chassis. The fan is configured to provide a first airflow through the first aperture and into the sidewall fluid passageway for convective heat transfer from the at least one sidewall to the first airflow. The fan is configured to provide a second airflow through the second aperture and into the standoff fluid passageway for convective heat transfer from the standoff to the second airflow.

BRIEF DESCRIPTION OF THE DRAWINGS

The present disclosure will hereinafter be described in conjunction with the following drawing figures, wherein like numerals denote like elements, and wherein.

DETAILED DESCRIPTION

The following detailed description is merely exemplary in nature and is not intended to limit the present disclosure or the application and uses of the present disclosure. Furthermore, there is no intention to be bound by any theory presented in the preceding background or the following detailed description.

Example embodiments disclosed herein include a support structure that supports and/or at least partially encloses an electronic component therein. The support structure may include a chassis and a standoff that supports the electronic component with respect to the chassis. At least one fluid passageway may be defined through the standoff. A fluid may flow through the passageway for convectively transferring heat generated by the electronic component away from the support structure. In some embodiments, transverse members may extend transversely across the fluid passageway and may be exposed to the fluid flowing through the passageway. Accordingly, heat in the transverse members may convectively transfer to the flowing fluid and away from the support structure. Furthermore, multiple features may be integrally connected together to define a monolithic and unitary component. In some embodiments, one or more of these components may be manufactured via an additive manufacturing (e.g., 3-D printing) technique. Additional details of the present disclosure will be discussed below.

Figure 1:
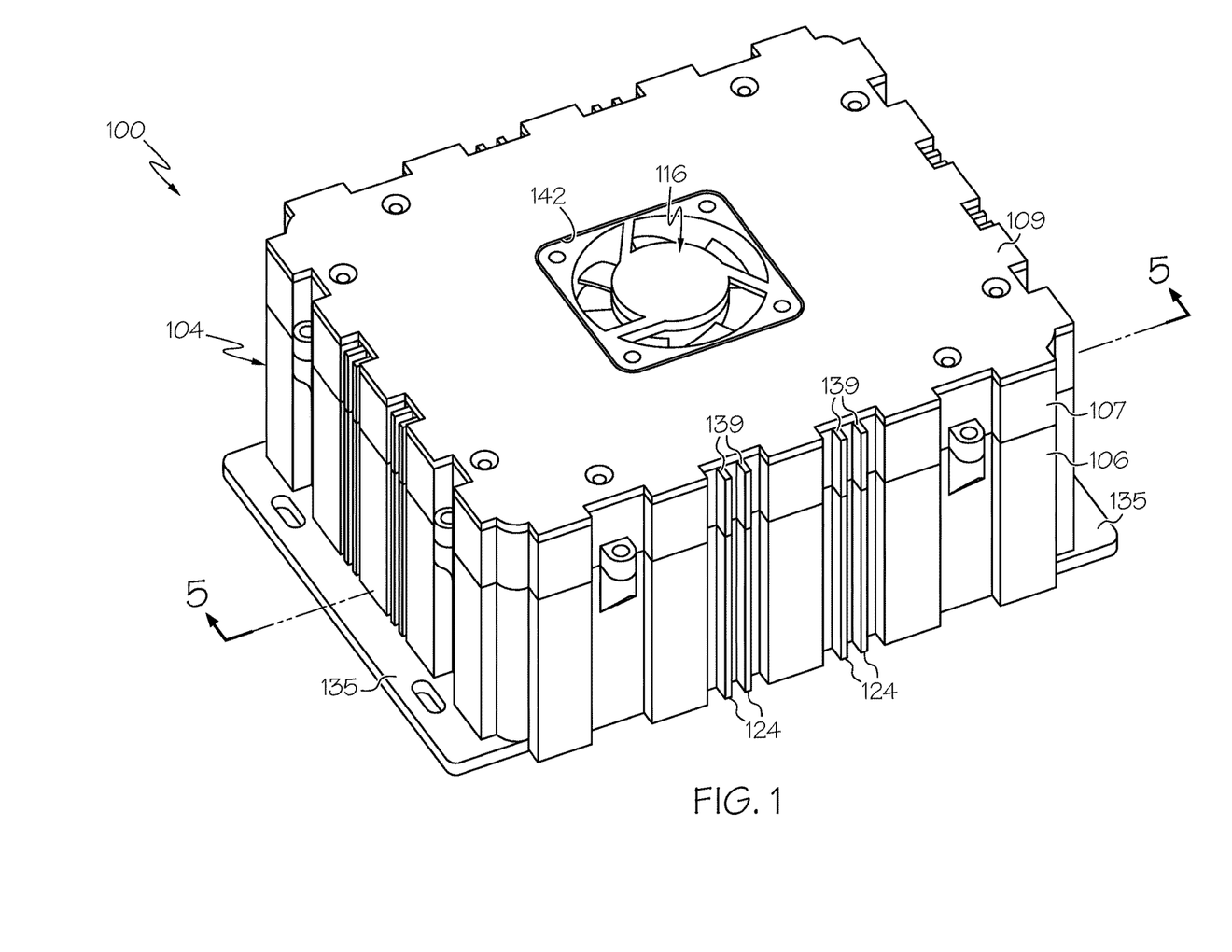
FIG. 1 is a perspective view of a support structure for one or more electronic components according to example embodiments of the present disclosure.

Referring initially to FIG. 1, a support structure 100 is illustrated according to example embodiments of the present disclosure. Generally, the support structure 100 may be configured to support and, in some cases, enclose electronics (i.e., one or more electronic components).

Figure 4:
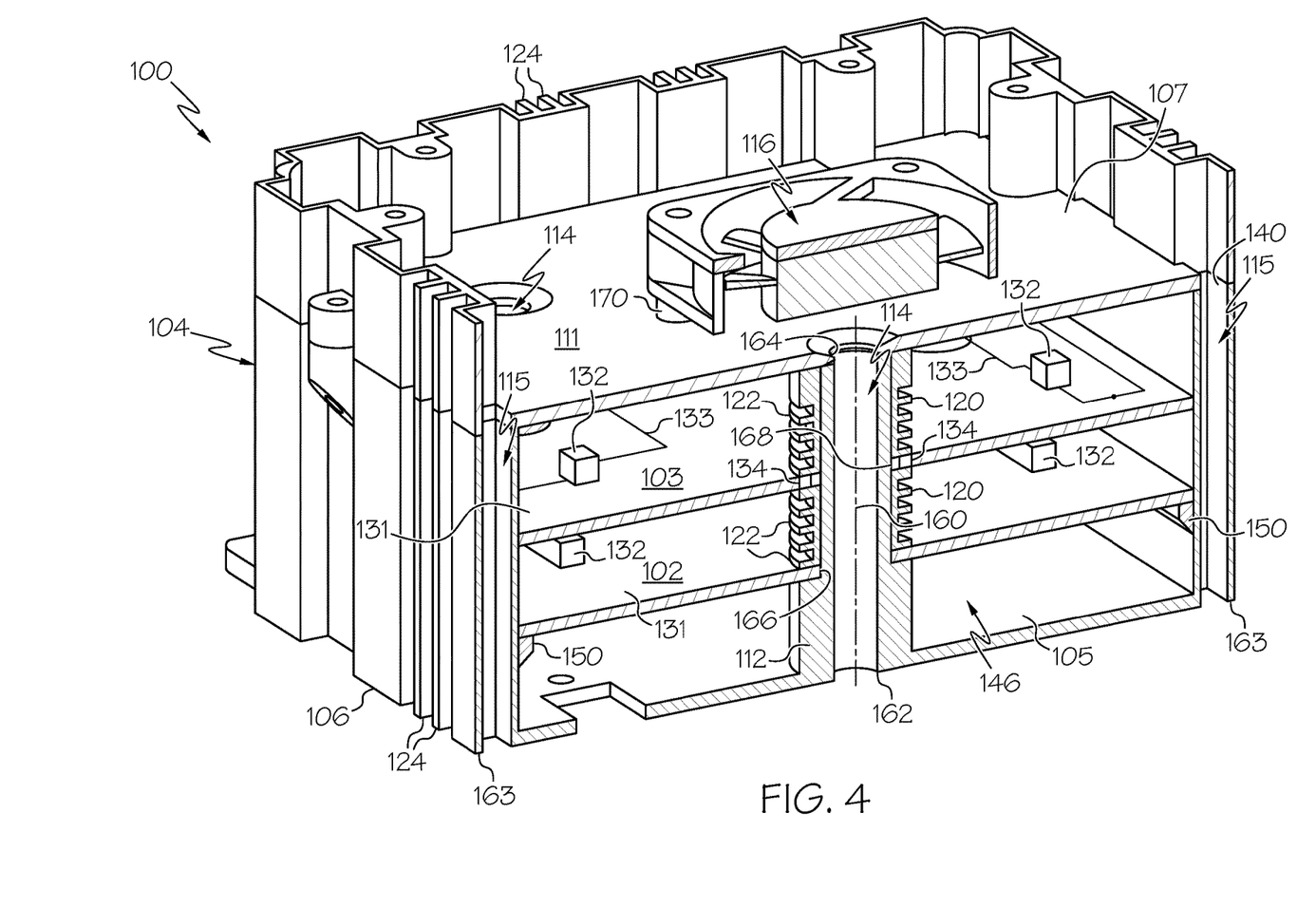
FIG. 4 is a perspective section view taken along the line 4-4 of FIG. 2.
Figure 5:
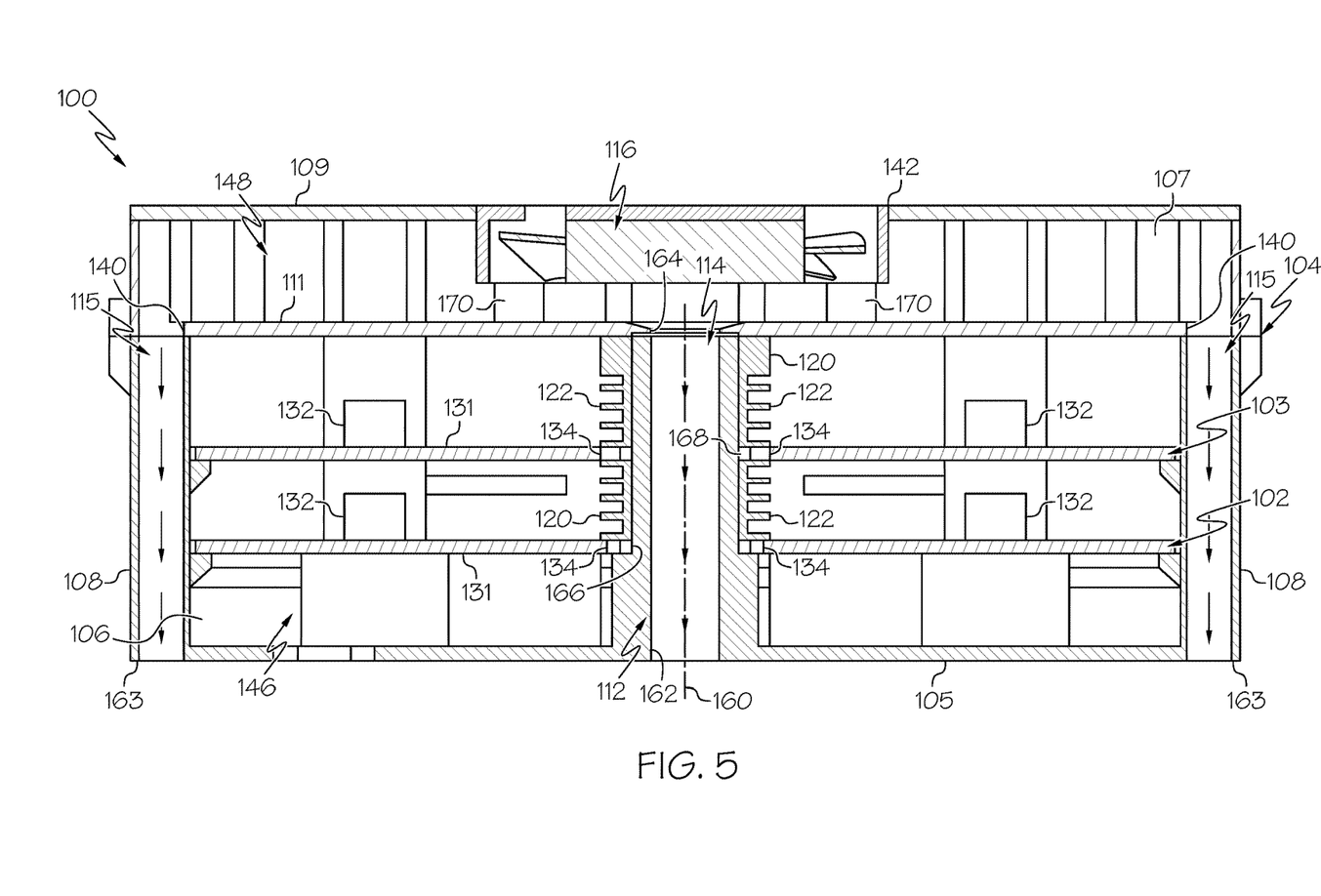
FIG. 5 is a longitudinal section view taken along the line 5-5 of FIG. 1.

As shown in FIGS. 4 and 5, for example, the electronic components supported by the structure 100 may include a plurality of printed circuit boards (PCBs), such as a first PCB 102 and a second PCB 103. It will be appreciated that support structure 100 can be configured to support any number of PCBs (e.g., more or less than two) and that the first and second PCBs 102, 103 are merely examples. Also, it will be appreciated that the PCBs 102, 103 may be disposed and arranged on the support structure 100 in other ways than in the Figures without departing from the scope of the present disclosure. Additionally, it will be appreciated that the support structure 100 may be configured to support electronic components other than PCBs.

The first and/or second PCBs 102, 103 may include a substantially flat and plate-like substrate 131. The substrate 131 may be made from an electrically insulative material. The PCBs 102, 103 may also include one or more electrical devices 132, such as integrated circuits, resistors, capacitors, etc. that are supported (e.g., soldered) on the substrate 131. Furthermore, the PCBs 102, 103 may include electrical tracks or vias 133 (FIG. 4). The vias 133 may be elongate and made out of electrically conductive material that is etched into the substrate 131. At least one of the vias 133 may be configured for electrically connecting multiple ones of the electrical devices 132 in some embodiments. Also, at least one of the vias 133 may be electrically connected to an external connector (not shown) that establishes electrical connection with an external component, such as a computerized memory device, a keyboard or other input device, a display or other output device, etc. It will be appreciated that the PCBs 102, 103 may include one or more soldered or otherwise attached parts; therefore, the PCBs 102, 103 may be referred to as printed circuit board assemblies (PCBAs or PCAs).

As shown in FIGS. 4 and 5, the PCBs 102, 103 may include one or more thermal paths 134. The thermal paths 134 may be made out of thermally conductive material. The thermal path 134 may be an annular ring, pad, or other shape. The thermal paths 134 may be supported by the substrate 131. In some embodiments represented in FIG. 5, the thermal paths 134 may extend through the substrate 131 in a thickness direction. The thermal paths 134 may be disposed in any suitable location on the substrate 131. The thermal path 134 may be connected to the top layer and also thermally connected to the thermal plane of the respective PCB 102, 103. As will be discussed, the thermal paths 134 may provide a conductive heat transfer path, for example, for transferring heat away from the electrical devices 132, the substrate 131, etc.

In some embodiments, the PCBs 102, 103 may be configured for control of a computerized vehicle system. Specifically, in some embodiments, the PCBs 102, 103 may be configured for operations of an avionics system of an aircraft. In additional embodiments, the PCBs may be configured for operations of a flight systems management system of an aircraft. As will be discussed, the support structure 100 can be especially compact and, therefore, useful in these and other space-restrictive locations.

The support structure 100 may include a chassis 104. The chassis 104 may be hollow and box-like. The chassis 104 may mechanically support the PCBs 102 and may include features for transferring heat away from the PCBs 102.

In some embodiments, the chassis 104 may generally include a lower member 106, an intermediate member 107, and a top member 109. The lower member 106, intermediate member 107, and top member 109 are shown in FIGS. 1 and 5. The top member 109 is hidden in FIGS. 2 and 4. The intermediate member 107 and the top member 109 (as well as the PCBs 102, 103) are hidden in FIG. 3.

Figure 3:
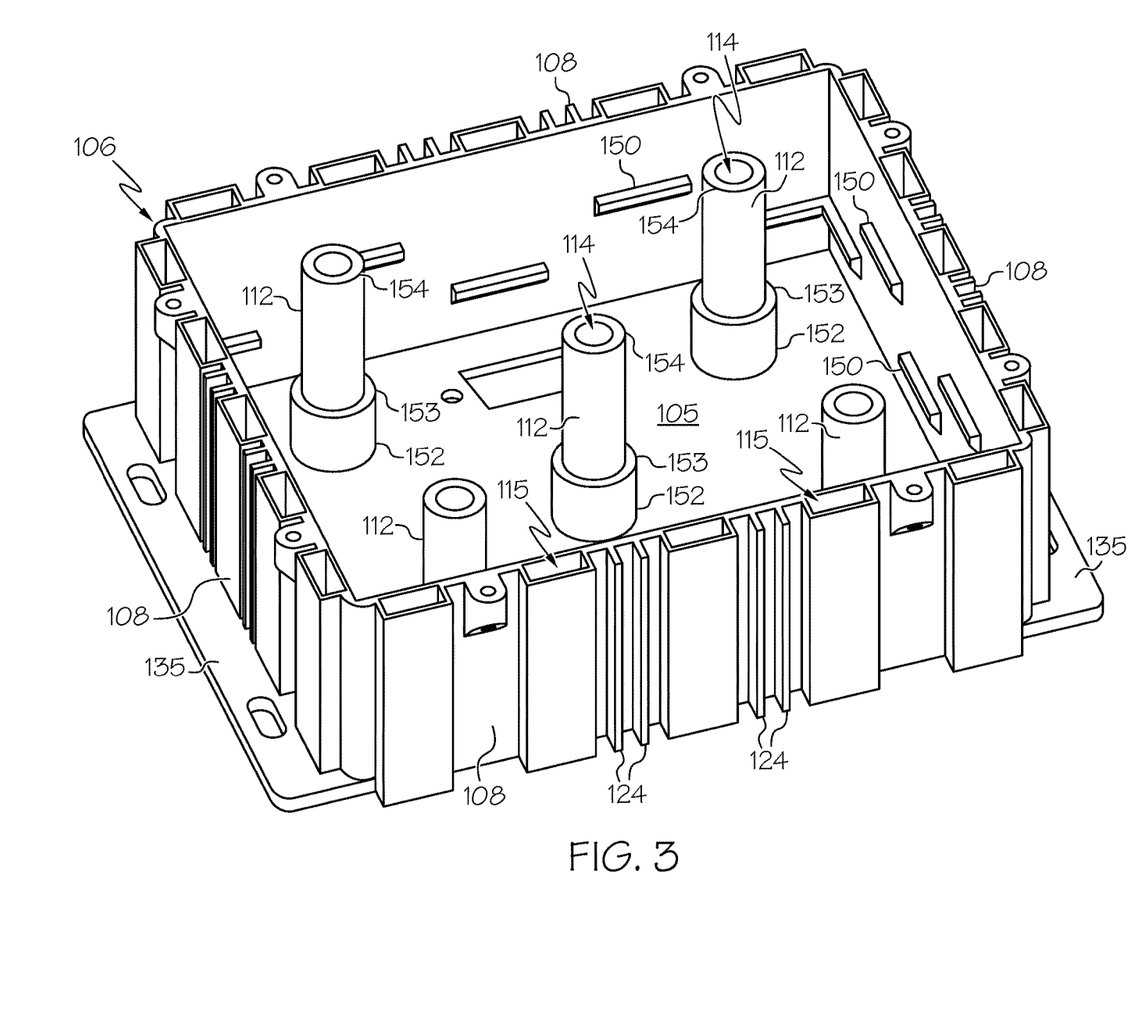
FIG. 3 is a perspective view of part of a chassis and standoffs of the support structure of FIG. 1.

As shown in FIG. 3, the lower member 106 may include a base 105 and one or more side walls 108. The base 105 may be a substantially flat and thin-walled member that extends in a horizontal direction. In some embodiments, the base 105 may define a horizontal flange 135. The flange 135 may be used for attaching and mounting the support structure 100 to another structure.

The side wall(s) 108 may extend from a periphery of the base 105 generally vertically from the base 105. As shown in the illustrated embodiment, there may be four side walls 108 arranged in a rectangle about the periphery of the base 105. However, it will be appreciated that there may be any number of side walls 108 arranged in any suitable shape.

In some embodiments, the side walls 108 may include one or more projections 124. The projections 124 may project outwardly from the side walls 108. In some embodiments, the projections 124 may be rib-like and may be elongated in the vertical direction.

Additionally, the side walls 108 may include one or more support ridges 150 (FIG. 3). The support ridges 150 may project inwardly from the respective side wall 108. The support ridges 150 may be elongated in the horizontal direction as well. As shown in FIG. 4, the support ridges 150 may be configured to support the PCBs 102, 103.

Also, in some embodiments, at least one side wall 108 may include at least one side wall fluid passageway 115. The side wall fluid passageway 115 may be a tubular passageway that extends vertically along the side wall 108. In some embodiments, the sidewall fluid passageway 115 may be open at both ends (FIGS. 4 and 5). As shown in FIGS. 4 and 5, the base may include base side openings 163 that provide access into and/or out of the lower ends of the side wall fluid passageways 115.

In some embodiments, there may be a plurality of side wall fluid passageways 115. The passageways 115 may be spaced apart from adjacent passageways 115 with one or more projections 124 disposed between the adjacent passageways 115.

Figure 2:
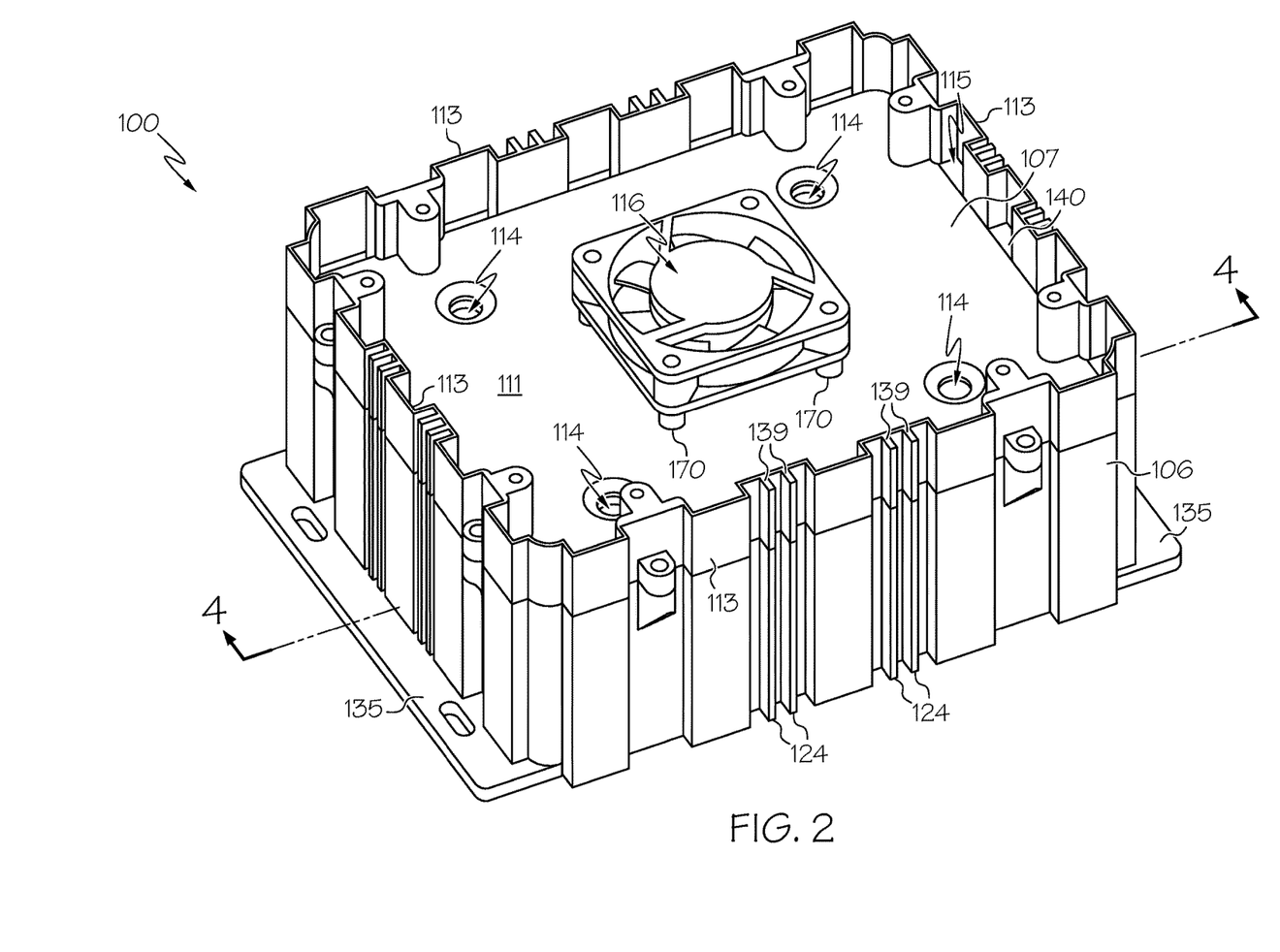
FIG. 2 is a perspective view of part of the support structure of FIG. 1.

As shown in FIGS. 2 and 4, the intermediate member 107 may include an upper wall 111 and a plurality of peripheral walls 113. The upper wall 111 may be a substantially flat and thin-walled member that extends generally in the horizontal direction. The peripheral walls 113 may extend upward from the periphery of the upper wall 111. As shown in FIG. 4, the intermediate member 107 may be supported atop and attached to the side walls 108 of the lower member 106. As such, the upper wall 111 may be separated at a distance from the base 105. Also, in some embodiments, the peripheral walls 113 may be substantially flush with respective ones of the side walls 108. As such, the projections 124 of the lower member 106 may be substantially continuous in the vertical direction with respective projections 139 of the peripheral walls 113.

Additionally, in some embodiments, the intermediate member 107 may include one or more sidewall apertures 140 (FIGS. 2, 4, and 5). The sidewall apertures 140 may extend through the thickness of the upper wall 111, adjacent the peripheral walls 113. The sidewall apertures 140 may be disposed so as to be open to (i.e., in fluid communication) with respective ones of the side wall fluid passageways 115 of the lower member 106.

Moreover, as shown in FIGS. 1 and 5, the top member 109 may be a substantially flat and thin-walled member. The top member 109 may extend between and may be supported by the peripheral walls 113 of the intermediate member 107. As such, the top member 109 may be spaced apart at a distance from the upper wall 111 of the intermediate member 107. In some embodiments, the top member 109 may include an opening 142.

Accordingly, the base 105, the side walls 108, and the upper wall 111 may cooperate to define a lower chamber 146 (FIGS. 4 and 5). Also, the upper wall 111, the peripheral walls 113, and the top member 109 may cooperate to define an upper chamber 148 (FIG. 5). The upper wall 111 may separate the lower chamber 146 from the upper chamber 148.

Moreover, as shown in FIGS. 3-5, the support structure 100 may include one or more standoffs 112. In the embodiment illustrated, there are five standoffs 112; however, it will be appreciated that the support structure 100 may include more or less standoffs 112 than the ones shown.

The standoff 112 may be cylindrical in some embodiments and may include a lower end 152 and an upper end 154. In some embodiments, the standoff 112 may have a rounded (e.g., circular) horizontal cross section. Furthermore, the standoff 112 may include a shoulder 153 disposed between the lower end 152 and the upper end 154. Accordingly, the standoff 112 may be wider closer to the lower end 152 than at the upper end 154. Also, the width of the standoff 112 changes at the shoulder 153.

The lower end 152 of the standoff 112 may be attached (e.g., fixed) to the base 105, and the standoff 112 may extend along a vertical axis 160 toward the upper wall 111. In some embodiments, the lower end 152 may be integrally attached to the base 105 such that the standoff 112 and the base 105 (as well as the sidewalls 108) cooperatively define a monolithic and unitary member (FIG. 3). The standoffs 112 may be spaced horizontally apart from each other on the base 105. The upper end 154 of the standoffs 112 may abut and support the upper wall 111.

Also, in some embodiments, the standoff 112 may be hollow and cylindrical so as to include a standoff fluid passageway 114. The standoff fluid passageway 114 may extend along and may be centered on the respective axis 160. The standoff fluid passageway 114 may also have a substantially constant width (e.g., diameter) along the axis 160. In some embodiments, the standoff fluid passageway 114 may be substantially centered on the respective axis 160 of the standoff 112. Also, the standoff fluid passageway 114 may be open at the upper end 154 and the lower end 152. The upper wall 111 may include one or more upper openings 164 (FIGS. 4 and 5) that are open to (i.e., fluidly connected to) respective ones of the standoff fluid passageways 114. Similarly, the base 105 may include one or more base openings 162 (FIGS. 4 and 5) that are open to respective ones of the standoff fluid passageways 114. Accordingly, air or other cooling fluid may enter the fluid passageway 114 via the respective upper opening 164 and may exit the fluid passageway 114 via the respective base opening 162. In the illustrated embodiments, the upper openings 164 and the base openings 162 are sized and shaped according to that of the fluid passageway 114; however, it will be appreciated that the upper opening 164 and/or base opening 162 may be sized and/or shaped differently without departing from the scope of the present disclosure.

As shown in FIGS. 4 and 5, the first and second PCBs 102, 103 may be supported and enclosed within the lower chamber 146 of the support structure 100. In some embodiments, the first and second PCBs 102, 103 may extend substantially horizontally between the side walls 108. Also, the first and second PCBs 102, 103 may substantially parallel with the base 105 and the upper wall 111. Furthermore, the first and second PCBs 102, 103 may be spaced vertically apart from each other and spaced vertically apart from the base 105 and the upper wall 111.

In some embodiments, the periphery of the first and second PCBs 102, 103 may be supported atop the support ridges 150 of the side walls 108. Also, the first and second PCBs 102, 103 may be supported by the standoffs 112.

For example, the first PCB 102 may include apertures 166 that receive respective ones of the standoffs 112. An example aperture 166 may be a circular hole that extends through the thickness of the first PCB 102, wherein the diameter of the aperture 166 is sized to receive the standoff 112, and wherein the edges of the aperture 166 rest vertically on the shoulder 153 of the standoff 112. Accordingly, the first PCB 102 may be supported in the vertical direction. Additionally, in some embodiments, movement of the first PCB 102 in the horizontal direction may be limited by the standoff 112.

Additionally, the second PCB 103 may include apertures 168 that receive respective ones of the standoffs 112. An example aperture 168 may be a circular hole that extends through the thickness of the second PCB 103, wherein the diameter of the aperture 166 is sized to receive the standoff 112. In some embodiments, the edges of the aperture 168 may be frictionally fit to the standoff 112 for support in the vertical and horizontal direction. In other embodiments, the edges of the aperture 168 may extend more loosely about the standoff 112, but the standoff 112 may support the second PCB 103 and limit its horizontal movement.

Furthermore, as shown in FIGS. 4 and 5, the support structure 100 may include one or more spacers 120. The spacers 120 may be hollow and disc-like. The spacers 120 may also encircle respective ones of the standoffs 112. In some embodiments, each spacer 120 may include at least two arcuate pieces that are attached together (e.g., via fasteners) to encircle the standoff 112. Also, in some embodiments, the spacers 120 may include a plurality of projections 122. The projections 122 may project radially outward and away from the standoff 112. In some embodiments, the projections 122 may be thin discs that encircle the spacer 120.

As shown, at least one spacer 120 may be disposed between the first PCB 102 and the second PCB 103 to support the PCBs 102, 103 in the vertical direction and to maintain a predetermined distance between the adjacent PCBs 102, 103. Also, at least one spacer 120 may be disposed between the second PCB 103 and the upper wall 111 to maintain a predetermined distance between the PCB 103 and the upper wall 111.

Moreover, the support structure 100 may include a fluid pump for moving and/or circulating a fluid through the support structure 100. For example, a fan 116 may be included for moving air through the support structure 100. However, it will be appreciated that a hydraulic pump may be included for moving a liquid coolant through the support structure 100. It will also be appreciated that the fan 116 (or other fluid pump) may be omitted.

In some embodiments, the fan 116 may be supported and attached atop the upper wall 111. The intermediate member 107 may include one or more spacers 170 (FIGS. 4 and 5) that project from the upper wall 111. The spacers 170 may support the fan 116 and maintain the fan 116 at a distance from the upper surface of the upper wall 111. An opposite end of the fan 116 may be received within the opening 142 in the top member 109. In some embodiments, the fan 116 may be substantially centered within the upper chamber 148 of the support structure 100.

The fan 116 can be configured to suck air through the opening 142 and blow air throughout the upper chamber 148. This air may blow into the standoff fluid passageways 114 and the side wall fluid passageways 115. Then, the air may exit the support structure 100 via the base openings 162 and the base side openings 163. This fluid flow can transfer heat that is generated by the PCBs 102, 103 convectively away from the support structure 100.

It will be appreciated that the illustrated embodiment of the support structure 100 is configured for active conductive heat transfer because it includes the fan 116. Also, it will be appreciated that the fan 116 may blow unfiltered air through the support structure 100 in some embodiments because the PCBs 102, 103 are substantially enclosed and protected from any dust or debris within the airflow. In other embodiments, however, a filtration device may be employed for filtering the air that the fan 116 blows through the support structure 100. Moreover, it will be appreciated that the support structure 100 may be configured for passive (i.e., natural) conductive heat transfer without departing from the scope of the present disclosure. The diameter and/or other dimensions of the support structure 100 may be configured to ensure natural convection and to provide adequate heat transfer. Also, in this case, the fan 116 may be omitted, and air or other cooling fluid may move through the support structure 100 due to temperature gradients in different areas of the support structure 100.

Furthermore, it will be appreciated that the support structure 100 may provide an open convective heat transfer system, wherein air is sucked into the support structure 100 and is blown out of the support structure 100. However, it will be appreciated that the support structure 100 may be configured as a closed heat transfer system where air or other cooling fluid is substantially contained within the support structure 100 and is circulated therethrough.

During operation of the PCBs 102, 103, a significant amount of heat may be generated. Excessive heat may conductively transfer (e.g., via the thermal paths 134) to the standoffs 112 and the chassis (as well as the spacers 120). Meanwhile, the fan 116 may blow air through the fluid passageways 114, 115 allowing the heat in the standoffs 112 and side walls 108 to conductively transfer to the moving air in the passageways 114, 115. This air may be exhausted away from the support structure 100 via the openings 162, 163 in the base 105. This thermal path may ensure that there are substantially uniform temperature zones or islands across the PCBs 102, 103.

Accordingly, the support structure 100 provides effective and efficient cooling to the PCBs 102, 103 and maintains operating temperatures within a predetermined range. Also, the support structure 100 may be very compact, even when a large number of PCBs are included.

Figure 6:
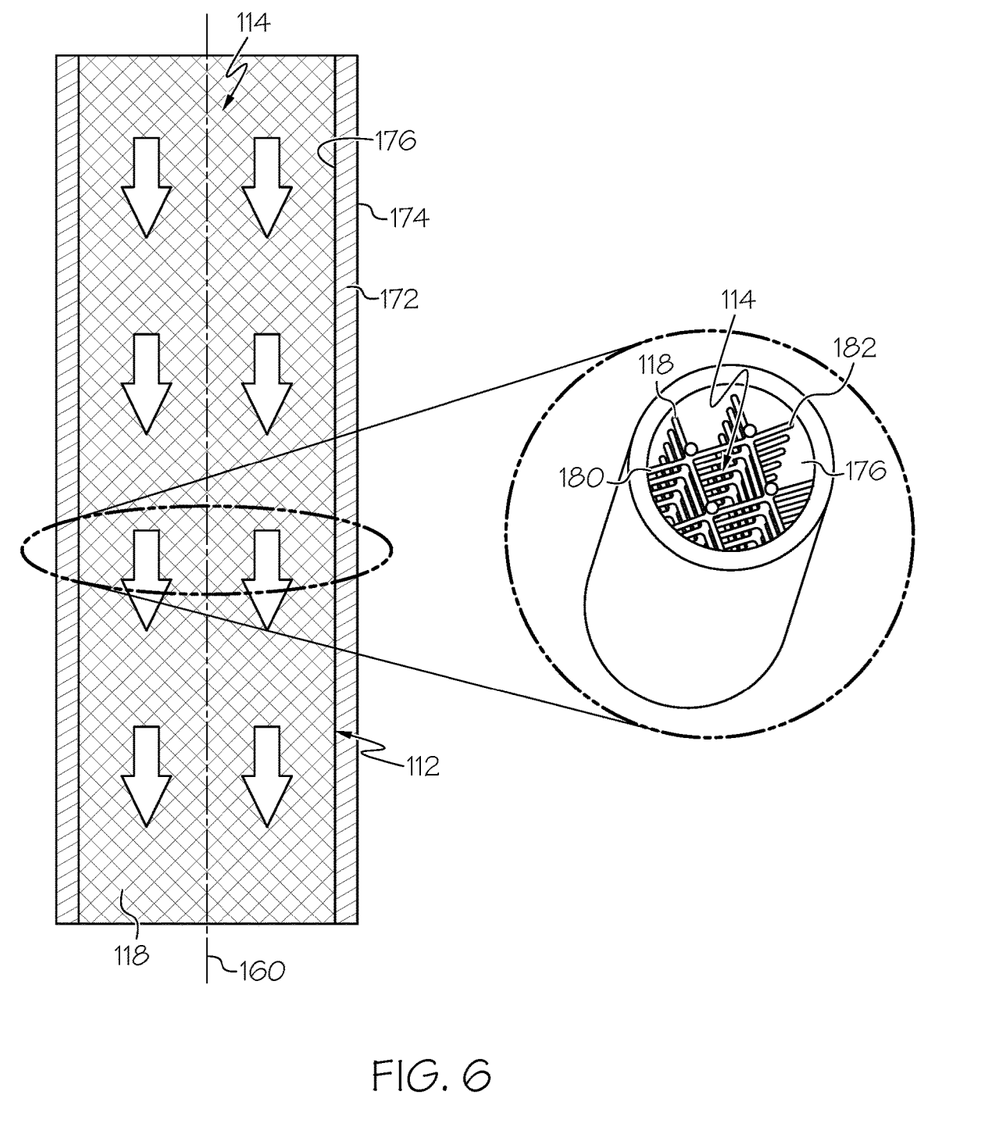
FIG. 6 is a detail view of a standoff of the support structure of FIG. 1 according to example embodiments.
Figure 7:
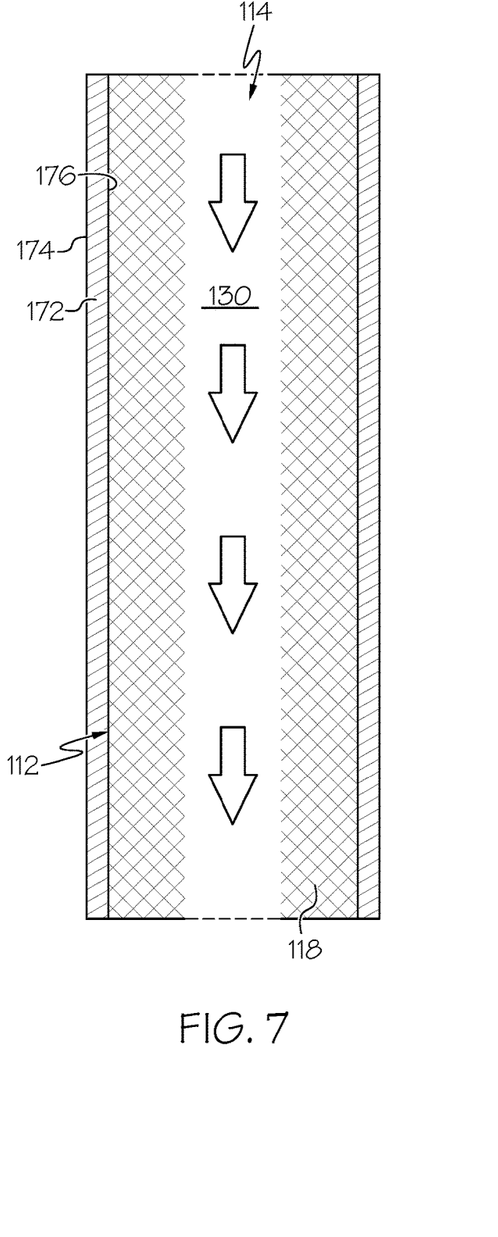
FIG. 7 is a detail section view of a standoff of the support structure of FIG. 1 according to additional example embodiments.
Figure 8:
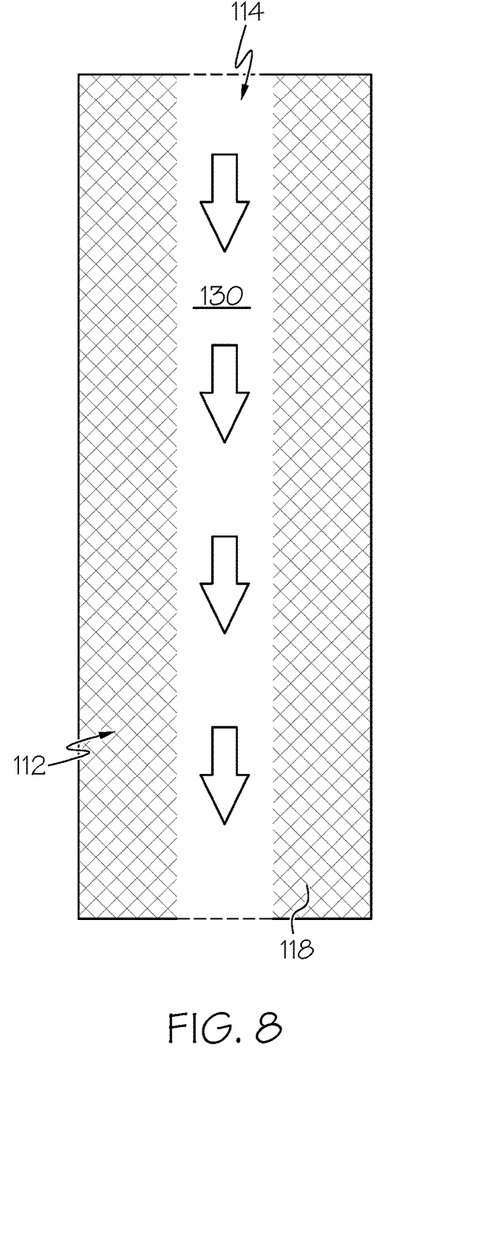
FIG. 8 is a detail section view of a standoff of the support structure of FIG. 1 according to additional example embodiments.

In some embodiments represented in FIGS. 6-8, the support structure 100 may include a plurality of transverse members 118. The transverse members 118 may be elongate (e.g., tubes, pin-shaped projections, etc.), and the transverse members 118 may be interconnected together. The transverse members 118 may be disposed within and/or define the standoff fluid passageway 114. In some embodiments, the transverse members 118 may be integrally attached together so as to define a unitary member with interwoven or interconnected transverse members 118. Also, in some embodiments, the unitary transverse members 118 may be integrally connected with the wall 172 to be unitary with the standoff 112. Furthermore, in some embodiments, the transverse members 118 may be integrally connected to the base 105 to be unitary with the base 105. Although not shown, the transverse members 118 shown in FIGS. 6-8 and/or described herein may also be included in the side wall fluid passageways 115 of the support structure 100.

As shown in the embodiment of FIG. 6, the transverse members 118 may be disposed within a tubular wall 172 of the standoff structure 112. The tubular wall 172 may be non-porous and may have an inner diameter surface 176, which defines the passageway 114, and an outer diameter surface 174, which is opposite the inner diameter wall 176. The transverse members 118 may extend in a transverse direction (i.e., substantially in the radial direction) between opposing areas of the inner diameter surface 176. Specifically, as shown in the inset of FIG. 6, a single transverse member 118 may include a first end 180 and a second end 182, which are attached to opposing areas of the inner diameter surface 176 and are suspended within the passageway 114.

Also, the plurality of transverse members 118 may be interconnected, but spaced apart enough to provide, at least, a porous passageway 114. For example, the transverse members 118 may collectively define a lattice, truss-like, cross hatch, interwoven, or other interconnected arrangement. The transverse members 118 may also be arranged in a way that directs the transfer of heat in a more efficient manner to the fluid flow within the passageway 114. The transverse members 118 may be exposed to the fluid (e.g., air) flowing through the fluid passageway 114. Accordingly, heat from the PCBs 102, 103 may eventually transfer to the transverse members 118 and transfer to the moving fluid within the fluid passageway 114.

In the embodiment of FIG. 7, the transverse members 118 may be arranged about the inner surface 176 of the wall 172 of the standoff 112. Also, in this embodiment, the transverse members 118 may define an open channel 130 through the fluid passageway 114.

The embodiment of FIG. 8 may be substantially similar to that of FIG. 7. However, the wall 172 of FIG. 6 may be omitted from the embodiment of FIG. 8. Accordingly, the transverse members 118 may substantially define the standoff 112 as described above. It will be appreciated that the transverse members 118 may collectively define a structurally sound support for the PCBs 102, 103. Also, in this embodiment, areas between adjacent transverse members 118 may allow air to pass from the open channel 130 into the lower chamber 146. This may provide an additional cooling effect for the PCBs 102, 103.

Figure 9:
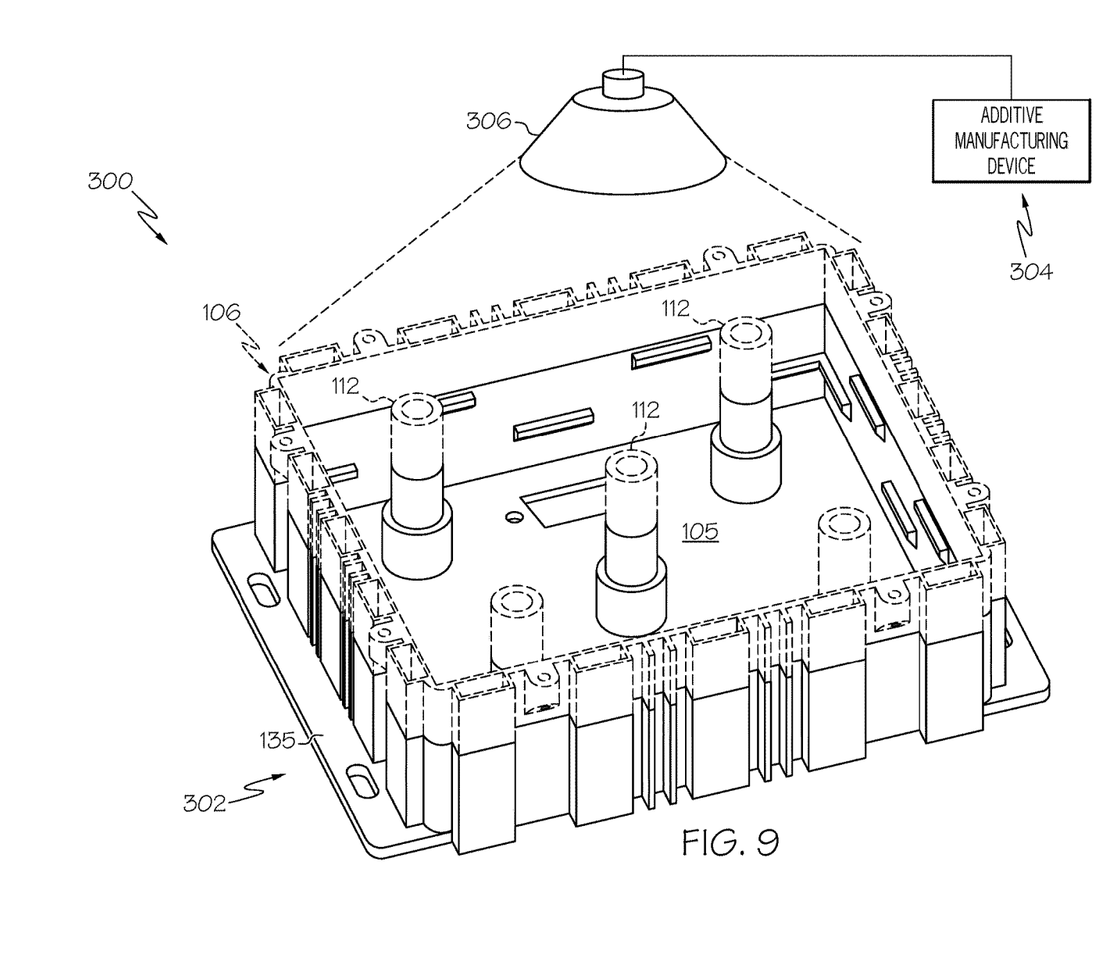
FIG. 9 is a schematic view of a manufacturing system for manufacturing at least a portion of the support structure of FIG. 1.

Manufacture of the support structure 100 may also provide advantages. For example, as represented in FIG. 9, the transverse members 118 may be integrally connected to the standoffs 112, and the standoffs 112 may be integrally connected to the base 105 of the lower member 106. Also, as shown, the transverse members 118 may be integrally connected to the side walls 108, and the side walls 108 may be integrally connected to the base 105. Accordingly, the transverse members 118, the standoffs 112, the base 105, and the side walls 108 may be integrally connected to collectively define a monolithic and unitary structure. This configuration may increase the heat transfer rate through the support structure 100.

Additionally, one or more components may be additively manufactured. For example, a three-dimensional (3-D) printer or other additive manufacturing device may be used to manufacture the monolithic structure described above and illustrated in FIG. 3. As such, the structure may be formed in a relatively short amount of time in a repeatable and accurate fashion. Furthermore, the overall part count for the support structure 100 can be fairly low because it includes the unitary, one-piece structure of FIG. 3. Additionally, the support structure 100 may include highly complex, curved surfaces that increase the heat transfer effects described above.

FIG. 9 illustrates an example manufacturing system 300 for manufacturing at least a portion of the support structure 100. The manufacturing system 300 may include an additive manufacturing device 304 (e.g., a 3-D printer) of a known type. The additive manufacturing device 304 may include a deposition device 306 that deposits a material in an additive manner to form a part. In FIG. 9, the deposition device 306 is shown forming the lower member 106 and standoffs 112 as a monolithic, unitary part. The base 105 and flange 135 are formed initially, and the side walls 108 and upper ends of the standoffs 112 are formed progressively. It will be appreciated that the transverse members 118 (FIGS. 6-8) may be formed using the additive manufacturing device 304 as well.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the present disclosure in any way. Rather, the foregoing detailed description will provide those skilled in the art with a convenient road map for implementing an exemplary embodiment of the present disclosure. It is understood that various changes may be made in the function and arrangement of elements described in an exemplary embodiment without departing from the scope of the present disclosure as set forth in the appended claims.

What is claimed is:

1. A support structure for an electronic component comprising:
   a chassis with a base and a side wall that extends from the base;
   a standoff that is attached to the chassis and that extends from the base, the standoff configured to support the electronic component and separate the electronic component at a distance away from the base of the chassis, the standoff configured to receive heat generated by the electronic component; and
   an upper wall that is attached to the side wall and the standoff, the upper wall being spaced apart from the base and the electronic component;
   wherein the standoff includes a fluid passageway, the fluid passageway configured to allow a cooling fluid to flow therethrough for convective heat transfer from the standoff to the cooling fluid;
   wherein the side wall includes a side wall fluid passageway configured to allow the cooling fluid to flow therethrough for convective heat transfer from the side wall to the cooling fluid;
   wherein the upper wall includes a first aperture that is in fluid communication with the fluid passageway of the standoff; and
   wherein the upper wall includes a second aperture that is in fluid communication with the side wall fluid passageway.

2. The support structure of claim 1, wherein the fluid passageway extends along an axis; and
   further comprising a plurality of transverse members;
   wherein the plurality of transverse members have a respective longitudinal axis that extends in a transverse direction that is substantially transverse to the axis of the fluid passageway; and
   wherein the plurality of transverse members are configured to be exposed to the cooling fluid for convective heat transfer from the plurality of transverse members to the cooling fluid.

3. The support structure of claim 2, wherein the plurality of transverse members are interconnected.

4. The support structure of claim 3, wherein the plurality of transverse members are disposed in a lattice arrangement.

5. The support structure of claim 2, wherein the standoff includes a tubular wall with an inner surface that defines the fluid passageway;
   wherein at least one of the plurality of transverse members includes a first end and a second end; and
   wherein the first end is attached to a first area of the inner surface of the fluid passageway, wherein the second end is attached to a second area of the inner surface of the fluid passageway such that the at least one of the plurality of transverse members is suspended within the fluid passageway between the first end and the second end.

6. The support structure of claim 2, wherein the plurality of transverse members collectively define at least a portion of the standoff;
   wherein the plurality of transverse members collectively define a porous outer surface of the standoff; and
   wherein the outer surface abuts the electronic component.

7. The support structure of claim 6, wherein the plurality of transverse members collectively define an inner surface of the standoff, the inner surface defining an open channel through the fluid passageway.

8. The support structure of claim 2, wherein the standoff includes a tubular wall with an inner surface that defines the fluid passageway;
wherein the plurality of transverse members are attached to the inner surface; and
wherein the plurality of transverse members collectively define an open channel through the fluid passageway.

9. The support structure of claim 1, wherein the electronic component is a first printed circuit board (first PCB) and further comprising a second printed circuit board (second PCB);
further comprising a spacer that is supported by the standoff;
wherein the spacer supports the second PCB apart from the first PCB at a distance; and
wherein the spacer includes a plurality of projections that project outward and away from the standoff.

10. The support structure of claim 1, wherein the chassis and the standoff are integrally connected to be unitary.

11. The support structure of claim 1, further comprising a pump that is configured to pump the cooling fluid through the fluid passageway; and
wherein the cooling pump is supported by the chassis.

12. The support structure of claim 1, wherein the sidewall and the base are integrally attached to be unitary.

13. The support structure of claim 1, wherein the electronic component is enclosed within a chamber defined by the chassis; and
wherein the standoff is porous to allow fluid communication through the standoff between the chamber and the fluid passageway of the standoff.

14. A method of manufacturing a support structure for a first electronic component and a second electronic component comprising:
providing a chassis;
providing a standoff, with a fluid passageway configured to allow a cooling fluid to flow therethrough for convective heat transfer from the standoff to the cooling fluid;
attaching the standoff to the chassis;
supporting the first electronic component on the standoff separated at a distance from the chassis and such that the standoff is configured to receive heat generated by the electronic component;
supporting a spacer on the standoff, the spacer including a plurality of projections that project outward and away from the standoff; and
supporting the second electronic component on the spacer such that the second electronic component is spaced apart from the first electronic component.

15. The method of claim 14, wherein attaching the standoff to the chassis includes integrally attaching the standoff to the chassis.

16. The method of claim 15, wherein attaching the standoff to the chassis includes additively manufacturing the chassis and the standoff.

17. The method of claim 14, wherein the fluid passageway extends along an axis; and
further comprising forming a plurality of transverse members, the transverse members having a respective longitudinal axis that extends in a transverse direction that is substantially transverse to the axis of the fluid passageway; and
wherein the plurality of transverse members are configured to be exposed to the cooling fluid for convective heat transfer from the plurality of transverse members to the cooling fluid.

18. The method of claim 14, wherein the first electronic component includes a first printed circuit board (first PCB); and
wherein the second electronic component includes a second printed circuit board (second PCB).

19. A support structure for electronics comprising:
a chassis that includes a base, at least one sidewall that is integrally attached to the base, and a top wall that is supported by the at least one sidewall, the top wall being spaced apart from the base, wherein the base, the at least one sidewall, and the top wall collectively define an interior of the chassis, wherein the at least one sidewall includes a sidewall fluid passageway, wherein the top wall includes a first aperture and a second aperture, and wherein the first aperture is in fluid communication with the sidewall fluid passageway;
a standoff that is integrally attached to the base and that extends between the base and the top wall along an axis, wherein the standoff includes a standoff fluid passageway that is in fluid communication with the second aperture;
a first printed circuit board (first PCB) that is supported by the standoff within the interior of the chassis, the standoff spacing the first PCB and the base of the chassis apart at a first distance;
a spacer that is supported by the standoff, the spacer including a plurality of projections that project outward and away from the standoff;
a second printed circuit board (second PCB) that is supported by the spacer apart at a second distance away from the first PCB; and
a fan that is supported by the chassis outside the interior of the chassis, the fan configured to provide a first airflow through the first aperture and into the sidewall fluid passageway for convective heat transfer from the at least one sidewall to the first airflow, the fan configured to provide a second airflow through the second aperture and into the standoff fluid passageway for convective heat transfer from the standoff to the second airflow.

20. The support structure of claim 19, further comprising a plurality of first transverse members that extend transversely across the sidewall fluid passageway, wherein the plurality of first transverse members are configured to be exposed to the first airflow for convective heat transfer from the at least one sidewall to the first airflow; and
further comprising a plurality of second transverse members that extend transversely across the standoff fluid passageway, wherein the plurality of second transverse members are configured to be exposed to the second airflow for convective heat transfer from the standoff to the second airflow.

* * * * *